United States Patent

Fratti

Patent Number: 6,068,130
Date of Patent: May 30, 2000

[54] DEVICE AND METHOD FOR PROTECTING ELECTRONIC COMPONENT

[75] Inventor: Roger A. Fratti, Cumru Township, Berks County, Pa.

[73] Assignee: Lucent Technologies Inc., Murray Hill, N.J.

[21] Appl. No.: 09/244,857

[22] Filed: Feb. 5, 1999

[51] Int. Cl.⁷ ...................................................... B65D 85/30
[52] U.S. Cl. ........................ 206/713; 206/715; 206/717
[58] Field of Search .................................. 206/713, 714, 206/715, 716, 717, 718, 719, 329, 330, 332

[56] References Cited

U.S. PATENT DOCUMENTS

| | | | |
|---|---|---|---|
| 4,568,416 | 2/1986 | Okui et al. | 206/716 X |
| 4,600,116 | 7/1986 | Inano et al. | 206/713 X |
| 4,961,984 | 10/1990 | Takeda | 206/716 X |
| 5,025,923 | 6/1991 | Okui | 206/714 |
| 5,089,314 | 2/1992 | Masujima et al. | 206/713 X |
| 5,108,299 | 4/1992 | Cronin . | |
| 5,158,818 | 10/1992 | Aunchio | 206/713 X |
| 5,163,850 | 11/1992 | Cronin . | |
| 5,165,985 | 11/1992 | Wiste . | |
| 5,223,321 | 6/1993 | Sinnadural et al. | 206/713 X |
| 5,314,732 | 5/1994 | Wiste . | |
| 5,652,410 | 7/1997 | Hobbs et al. . | |
| 5,682,731 | 11/1997 | Althouse | 206/713 X |
| 5,746,621 | 5/1998 | Cronin . | |
| 5,773,876 | 6/1998 | Mekdhanasarn et al. . | |

FOREIGN PATENT DOCUMENTS

| | | | |
|---|---|---|---|
| 0358063 | 3/1990 | European Pat. Off. | 206/332 |
| 405042969 | 2/1993 | Japan | 206/332 |
| 405051054 | 3/1993 | Japan | 206/379 |

*Primary Examiner*—Bryon P. Gehman
*Attorney, Agent, or Firm*—Dickstein Shapiro Morin & Oshinsky LLP

[57] ABSTRACT

A ring-shaped device is provided for protecting an electrostatic discharge sensitive electronic component. The protective device has a thin film support structure, adhesive material for securing the support structure to the leads of the electronic component, and conductive material for electrically connecting the leads together. The adhesive material may be a pressure sensitive adhesive. The conductive material may be an annular layer of metal deposited on the support structure. In addition, a central opening is provided in the support structure to accommodate a top portion of the electronic component. The electronic component may be protected while it is stored, handled and assembled into a larger system or device, such as a circuit board. The protective device may be used with a variety of electronic components, including components with different leads configurations and also taped components. The present invention is also applicable to a taped electronic components assembly that provides electrostatic discharge protection.

36 Claims, 3 Drawing Sheets

DEVICE AND METHOD FOR PROTECTING ELECTRONIC COMPONENT

BACKGROUND OF THE INVENTION

1. Field of the Invention

The present invention relates generally to devices for protecting electronic components that are sensitive to electrostatic discharge (ESD). The present invention also relates to procedures for handling, shipping, storing and/or assembling such sensitive components. Examples of electrostatic discharge sensitive components include Si bipolar and MOSFET devices, and GaAs MESFET devices, and other devices.

2. Discussion of the Related Art

Electrostatic discharge sensitive components may require special handling while they are shipped, stored, assembled, etc. to avoid being damaged. Sometimes the components must be handled in class 1 or higher rooms to avoid degradation or damage due to electrostatic discharge. The required special handling may increase the cost of manufacturing the larger systems, such as circuit boards, that incorporate such components. In addition, the cost of replacing electronic components damaged by electrostatic discharge may increase the total cost of the manufacturing process.

Electrostatic discharge sensitive components are particularly susceptible to damage before they are electrically inserted into a larger system (such as a circuit board). Once the leads of the electronic component are electrically connected to the larger system, there is less risk of damage, since the gate/base, source/emitter and drain/collector leads are no longer the only paths for electrostatic discharge currents. Consequently, there is a need in the art for protective devices and procedures for protecting electrostatic discharge sensitive components prior to assembly of such components into circuit boards and the like.

It has been suggested to strap the terminals of component devices together by a series of thermocompression attached gold (Au) wire bonds, to dissipate electrostatic charges that could otherwise build up on the terminals. This thermocompression bonding process would be costly, however, both in terms of the required materials and the labor required to assemble and subsequently remove the wire bonds. In addition, it would be difficult to remove the bonds after the component devices are inserted into larger systems.

Others have suggested the use of packaging films with conductive slivers to protect sensitive electronic components. Such films are referred to in U.S. Pat. Nos. 5,314,732 and 5,165,985 (Wiste). The packaging films described in the Wiste patents would not be fully satisfactory, however, because they would not ensure electrical contact with the leads of the packaged component. Moreover, the packaging film would have to be at least partially removed from the component during assembly of the component into a circuit board. Consequently, the component would be susceptible to electrostatic discharge damage or degradation during the time while it is being assembled into the circuit board.

Other devices for providing electrostatic discharge protection are shown in U.S. Pat. No. 5,773,876 (Mekdhanasarn), U.S. Pat. No. 5,746,621 (Cronin), U.S. Pat. No. 5,652,410 (Hobbs), U.S. Pat. No. 5,163,850 (Cronin), and U.S. Pat. No. 5,108,299 (Cronin).

There is a need in the art for an uncomplicated, easy-to-use device or system for protecting electrostatic discharge sensitive components. There is also a need in the art for a convenient method of protecting such components while they are being assembled into circuit boards and the like.

SUMMARY OF THE INVENTION

The disadvantages of the prior art are overcome to a great extent by providing a protective device for protecting a packaged electronic component. According to one aspect of the invention, the protective device has a support structure for installation on the packaged electronic component and conductive material formed on said support structure for providing electrical connection between the electronic component's leads.

According to another aspect of the invention, the protective device has adhesive material for adhering the support structure to the electronic component.

In a preferred embodiment of the invention, the protective device has an opening for receiving a portion of the packaged electronic component, and the adhesive material and the conductive material are in thin rings surrounding the opening. The adhesive material may be a pressure sensitive adhesive. The conductive material may be a layer of electrodeposited metal, and the invention may be practiced with other suitable materials.

According to yet another aspect of the invention, the support structure may be formed of a flexible sheet of polymeric material.

The present invention also relates to a method of protecting an electrostatic discharge sensitive electronic component. The method includes the steps of connecting a support structure to the exposed conductive leads of the electronic component, and placing the leads in electrical contact with conductive material formed on the support structure. In a preferred embodiment of the invention, the support structure is adhesively connected to the leads, and a top portion of the electronic component extends through an open space in the center of the support structure.

According to one aspect of the invention, the protective structure is removed from the electronic component after the component is electrically connected to an electronic device such as a circuit board. This way, the electronic component remains protected from electrostatic discharge throughout the manufacturing process.

The present invention also relates to the combination of an electronic component and a protective device assembled on the electronic component. The invention is applicable to a wide variety of electronic components, including components with different leads configurations and also taped components. An advantage of the invention is that protective devices of a single size and configuration may be used to protect several different types of electronic components.

The present invention also relates to a taped electronic components assembly. The assembly may include conductive layers formed on a tape structure. The conductive layers remain with the tape structure when the electronic components are connected to a circuit board or the like.

In an alternative embodiment of the invention, protective devices are associated with individual electronic components, and a series of such protected components are supplied on a tape structure.

These and other features and advantages of the invention will become apparent from the following detailed description of preferred embodiments of the invention.

DETAILED DESCRIPTION OF PREFERRED EMBODIMENTS

Figure 1:
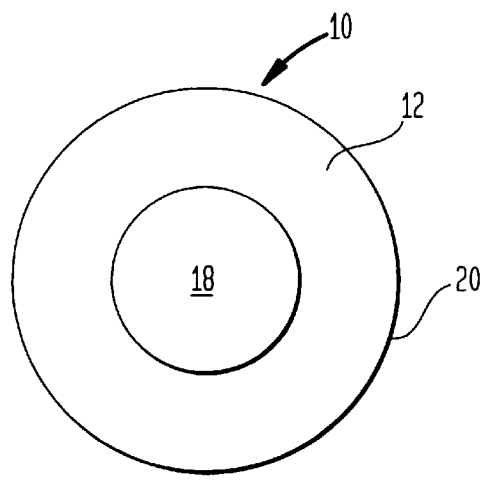
FIG. 1 is a top view of an electrostatic discharge protective device constructed in accordance with a preferred embodiment of the present invention.
Figure 2:
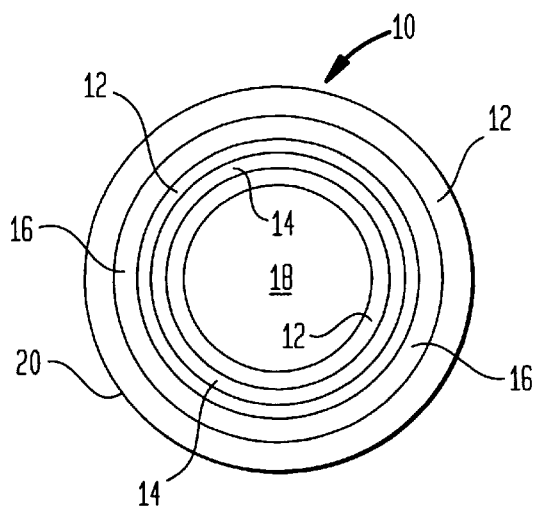
FIG. 2 is a bottom view of the protective device of FIG. 1.
Figure 3:
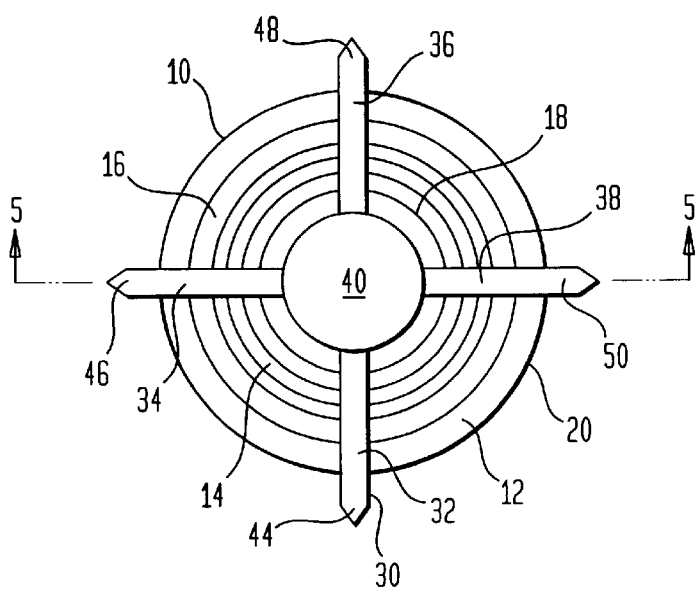
FIG. 3 shows the protective device of FIG. 1 attached to an electronic component.
Figure 4:
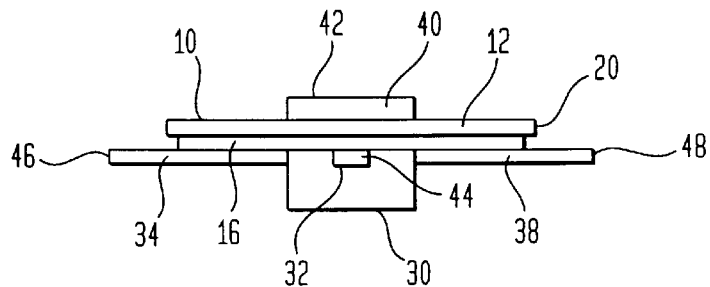
FIG. 4 is a side view of the assembly of FIG. 3.
Figure 5:
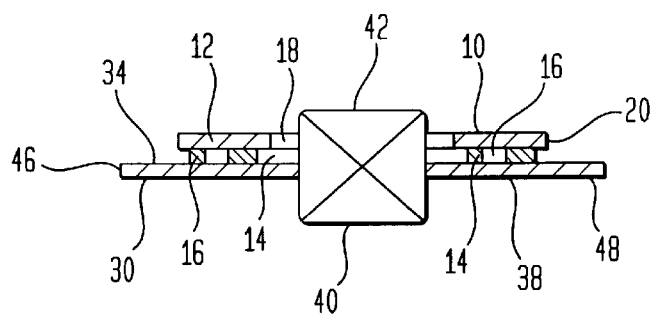
FIG. 5 is a cross sectional view of the assembly of FIG. 3, taken along the line 5—5 of FIG. 3.

Referring now to the drawings, where like reference numerals designate like elements, there is shown in FIG. 1 an electrostatic discharge protection device 10. The device 10 has a thin doughnut-shaped support sheet 12, a thin ring-shaped adhesive layer 14 (FIG. 2), and a thin ring-shaped conductive layer 16. The support sheet 12 may have a circular central opening 18 and a concentric periphery 20. The adhesive layer 14 and the conductive layer 16 may be concentric with the opening 18. In the illustrated embodiment, the adhesive layer 14 is located radially inside the conductive layer 16. The device 10 may be used to protect an electrostatic discharge sensitive electronic component 30 (FIGS. 3–5).

The sheet 12 should be somewhat flexible to bend slightly if necessary to ensure contact between the adhesive layer 14 and the leads 32, 34, 36, 38 of the protected electronic component 30 (as described in more detail below). On the other hand, the sheet 12 should be sufficiently rigid to provide structural support for the adhesive layer 14 and the conductive layer 16. The support sheet 12 may be made of a variety of inexpensive, light weight, easy to handle materials. In a preferred embodiment of the invention, the sheet 12 is made of a CAPTON™ polyimide film marketed by DuPont. The sheet 12 may be, for example, about two mils thick.

The adhesive layer 14 may be formed of a commercially available pressure sensitive adhesive. The thickness of the adhesive layer 14 may be about the same as or less than that of the support sheet 12. If desired, the protective device 10 may have a release layer (not illustrated) covering the adhesive layer 14. The adhesive layer 14 should preferably extend continuously around the entire periphery of the opening 18. This way, as described in more detail below, the protective device 10 does not have to be aligned with respect to the leads 32–38 of the protected component 30 to ensure that all of the leads 32–38 are contacted by the adhesive material 14.

The conductive layer 16 may be formed by a thick film metalization, sputtering, vapor deposition, or other deposition process. The conductive layer 16 may be formed of aluminum, gold or other suitable electrically conductive materials. The conductive layer 16 should preferably provide a continuous conductive path entirely around the central opening 18. The conductive layer 16 may form a closed circular conductive path. Alternatively, the conductive layer may be in the form of a spiral that extends around the central opening 18. The present invention should not be limited to the preferred embodiments shown in the drawings.

The device 10 preferably does not have to be aligned with respect to the leads 32–38 to ensure that the leads 32–38 are contacted by the conductive layer 16. In addition, the bottom surface of the conductive layer 16 (facing away from the support sheet 12) should provide good electrical connectivity along its entire length. To ensure such electrical connectivity, there should be substantially no insulating oxide or other insulating material on the bottom surface of the conductive layer 16.

The ring-shaped, annular configurations of the adhesive layer 14 and the conductive layer 16 are preferred because they reduce the amount of adhesive and conductive material 14, 16 required to ensure contact with the component leads 32–38. In addition, the annular configurations provide symmetry for the protective device 10 regardless of the orientation of the protective device 10. The present invention should not be limited, however, to the preferred embodiments described and illustrated herein. If desired, the adhesive and conductive layers may have other configurations, for example square, rectangular or discontinuous configurations.

The electronic component 30 (FIGS. 3–5) has a resin package 40 containing one or more electronic elements, semiconductor chips, electrical connectors and the like. In a preferred embodiment of the invention, the package 40 contains electrostatic discharge sensitive elements such as Si bipolar and MOSFET devices, GaAs MESFET devices, and the like, and the present invention is applicable to other electrostatic discharge sensitive elements in addition to those mentioned specifically herein. For clarity of illustration, the electronic elements inside the resin package 40 are not shown in the drawings.

The exposed conductive leads (or terminals) 32–38 are connected to the packaged electronic elements in a known manner. Although four leads are shown in the drawings, the invention may be practiced with electronic components that have more or fewer than four leads. In addition, although the leads 32–38 shown in FIGS. 3–5 extend generally straight in radial directions relative to the central package 40, the invention may be practiced with leads having a variety of configurations, including leads that have bent portions, as described in more detail below. Moreover, although the illustrated leads 32–38 are symmetrically arranged around the resin package 40, the invention may also be applicable to other configurations, including non-symmetrical leads configurations.

In operation, the release layer (if present) may be removed from the adhesive layer 14. Then the adhesive layer 14 is placed into adhesive contact with each of the leads 32–38. The adhesive connection between the leads 32–38 and the adhesive layer 14 holds the protective device 10 firmly on the electrostatic discharge sensitive electronic component 30. The adhesive layer 14 prevents the protective device 10 from being inadvertently dislodged from the electronic component 30.

The flexibility of the support sheet 12 accommodates slight deviations from planarity between the leads 32–38. That is, if the leads 32–38 are not located precisely all in the same plane, the sheet 12 will bend as necessary to ensure that adequate adhesive contact is made with all of the leads 32–38.

When the protective device 10 is in the assembled position (FIGS. 3–5), the conductive layer 16 contacts all of the leads 32–38 and provides a conductive path connecting all of the leads 32–38 together. The conductive path prevents an electrostatic potential from developing on one of the leads 32–38 and thereby reduces the risk of electrostatic discharge damage to the elements inside the resin package 40. In other words, the conductive layer 16 dissipates electric charges among the leads 32–38 and thereby provides an alternative path for electrostatic discharge currents that might otherwise damage the electronic component 30.

The illustrated coplanar relationship between the adhesive and conductive layers 14, 16 ensures that the conductive layer 16 remains in electrical contact with all of the leads 32–38 while the protective device 10 is in its assembled position. Slight deviations in planarity between the leads 32–38 are accommodated by the flexibility of the support sheet 12. The present invention should not limited to the illustrated coplanar relationship. When the leads have an angled relationship, the adhesive and conductive layers 14, 16 may have a corresponding relationship to ensure the desired contact between the adhesive layer 14, conductive layer 16 and the electrical contacts of the component 30.

The opening 18 may be sized to receive the top portion 42 of the resin package 40 in the assembled position. Thus, the opening 18 provides room for the adhesive layer 14 to contact the leads 32–38. If the electronic component has leads that bend downwardly, then the opening 18 may be sized to receive the inner portions of the leads, so that the adhesive layer 14 comes into firm contact with the leads, as discussed in more detail below in connection with FIG. 6.

To facilitate handling and identification of the leads 32–38, the diameter of the protective device 10 is preferably less than the longest dimensions of the electronic component 30. That is, the sheet 12 is preferably sized such that the ends 44, 46, 48, 50 of the component leads 32–38 extend radially outwardly beyond the sheet periphery 20.

The protective device 10 may remain in place on the electronic component 30 throughout the manufacturing phase until after the component 30 is electrically assembled into a larger device or system (not illustrated). Thus, for example, the protective device 10 may be installed by the manufacturer of the electronic component 30, and the protective device 10 may be removed by the manufacturer of the larger device or system (such as a circuit board).

The device 10 may be kept on the component 30 until after the component 30 is assembled into the larger device or system. This way, the electronic component 30 is protected from degradation or damage from electrostatic discharge while it is shipped from the first manufacturer to the second manufacturer and also while it is stored, handled and assembled by the second manufacturer. Alternatively, the protective device 10 may be installed by the second manufacturer (the manufacturer of the larger device or system).

Figure 6:
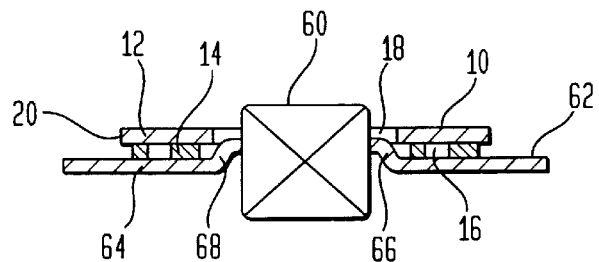
FIG. 6 is a cross sectional view of another protective device/electronic component assembly constructed in accordance with the present invention.

The invention may be used to protect a wide variety of electronic components that have electrostatic discharge sensitive elements. As shown in FIG. 6, for example, the protective device 10 may be used to protect a surface mount plastic package component 60 with non-linear leads 62, 64 that have downwardly extending portions 66, 68. The central opening 18 is sized to receive the downwardly extending portions 66, 68 to ensure contact between the adhesive and conductive layers 14, 16 and the leads 62, 64.

Figure 7:
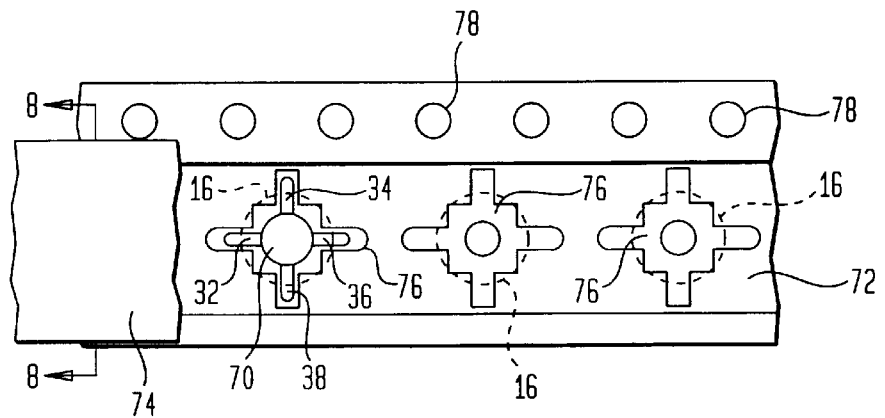
FIG. 7 is a partially broken away top view of a taped electronic components assembly constructed in accordance with another preferred embodiment of the present invention.

In addition, the present invention may be used to protect tape and reel packaged components 70 as shown for example in FIG. 7. The electronic component 70 shown in FIG. 7 is sandwiched between opposed tapes 72, 74. A series of other electronic components may be sandwiched between the same tapes 72, 74 in a manner known in the art. The successive components 70 are located in wells 76 formed in the first tape 72. Although only one component 70 is shown in FIG. 7 for the sake of clarity of illustration, like components are located in each of the wells 76 in the finished assembly.

Index holes 78 are located along at least one edge of the first tape 72 for use in handling the taped assembly on a reel apparatus (not illustrated). The cover tape 74 is located over and adheres to the edges of the first tape 72. Both tapes 72, 74 may be of indefinite length.

If desired, the components 70 shown in FIG. 7 may be the same as the components 30 shown in FIGS. 3–5.

Figure 8:
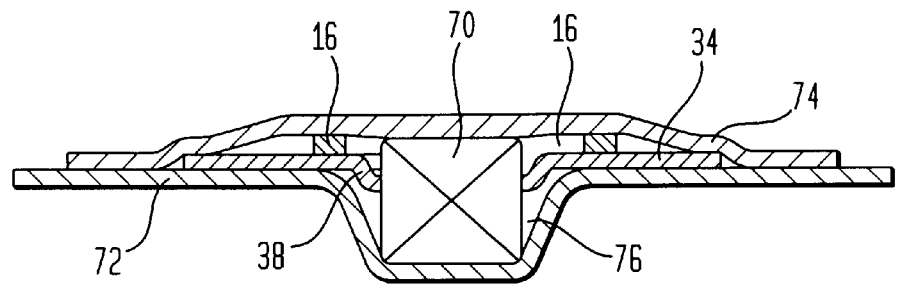
FIG. 8 is a cross sectional view of the taped electronic components assembly of FIG. 7, taken along the line 8—8.

As shown in FIG. 8, a ring-shaped conductive layer 16 may be formed on the cover tape 74. The conductive layer 16 extends in a continuous circle around the electronic component 70. The position of the conductive layer 16 is shown schematically by a dotted line in FIG. 7. The conductive layer 16 provides an electrically conductive path that connects the four leads 32–38 together. So long as the component 70 remains in the taped assembly, the component 70 is protected against electrostatic discharge damage.

The flexibility of the cover tape 74 ensures that each lead 32–38 remains in contact with the conductive layer 16. The conductive layer 16 may be electrodeposited onto the cover tape 16. This way, the conductive layer 16 stays with the cover tape 74 and is removed from the leads 32–38 when the component 70 is removed from the taped assembly. An advantage of the illustrated assembly is that it may be used without a separate ring-shaped layer of adhesive to connect the conductive layer 16 to the leads 32–38.

Figure 9:
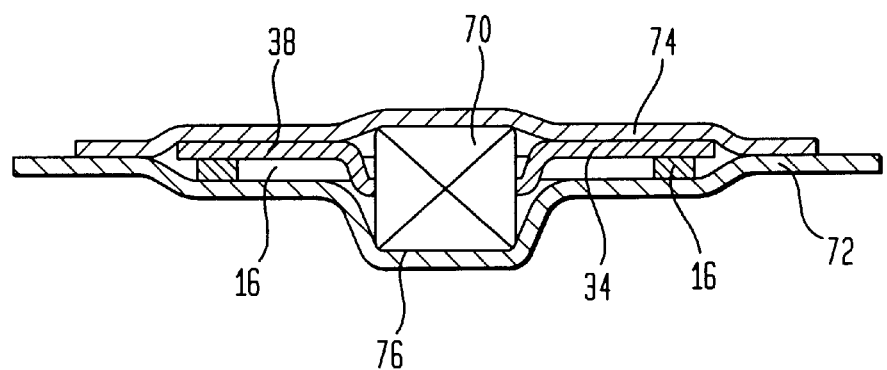
FIG. 9 is a cross sectional view of another taped electronic components assembly constructed in accordance with the present invention.

In the arrangement shown in FIG. 9, the ring-shaped conductive layer 16 is located between the leads 32–38 and the base tape 72. The conductive layer 16 may be electrodeposited on the base tape 72. In the illustrated embodiment, the conductive layer 16 stays with the base tape 72 when the electronic component 70 is removed from the well 76 of the taped assembly. An advantage of the illustrated arrangement is that there are no separate protective devices formed or remaining when the components 70 are removed from the taped assembly. Immediately upon removal from the assembly, the components 70 are ready to be connected to a circuit board or the like. A separate step of removing conductive straps or other material from the leads 32–38 is not needed. All of the conductive layers 16 remain with the tapes 72, 74. Thus, the invention provides an uncomplicated, easy to use method of assembly.

Figure 10:
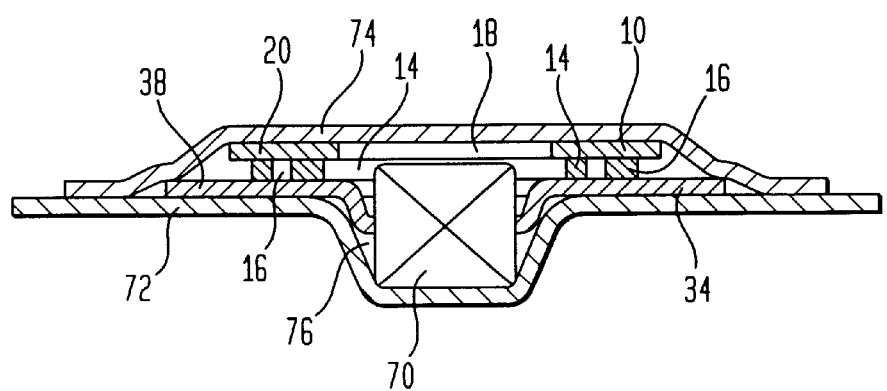
FIG. 10 is a cross sectional view of yet another taped electronic components assembly constructed in accordance with the present invention.

FIG. 10 shows another taped electronic components assembly constructed in accordance with the present invention. In the FIG. 10 assembly, the protective devices 10 of FIGS. 3–5 are individually attached to the electronic components 70. The FIG. 10 embodiment provides the convenience of tape and reel processing. In addition, it makes it possible to connect the components 70 to the circuit board (not illustrated) before the protective conductive layer 16 is disconnected from the leads 32–38.

In the FIG. 10 embodiment, the adhesive and conductive layers 14, 16 of the protective device 10 remain in contact with the leads 32–38 of the taped component 70 while the component 70 is supported within the tapes 72, 74. The protective device 10 may be removed from the electronic component 70 after the component 70 is electrically connected to a larger device or system, such as a circuit board.

The above descriptions and drawings are only illustrative of preferred embodiments which achieve the features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A method of protecting an electrostatic discharge sensitive electronic component, said electronic component having exposed conductive leads, said method comprising the steps of:
   connecting a support structure to said exposed conductive leads;
   locating a portion of said electronic component in an opening in said support structure; and
   placing at least some of said conductive leads in electrical contact with conductive material formed on said support structures,
   wherein said conductive material comprises ring-shaped metal layers.

2. The method of claim 1, wherein said step of connecting said support structure to said leads includes the step of applying adhesive material to said leads.

3. The method of claim 2, wherein said adhesive material comprises a non-circular pattern.

4. The method of claim 2, wherein said step of locating said portion of said electronic component in said opening occurs at the same time as said step of placing said leads in electrical contact with said conductive material.

5. The method of claim 4, wherein said adhesive material completely surrounds said opening.

6. The method of claim 5, wherein said conductive material completely surrounds said opening.

7. The method of claim 6, wherein said support structure comprises a thin film of polymeric material.

8. The method of claim 1, further comprising the step of electrically connecting said electronic component to an electronic device.

9. The method of claim 8, wherein said electronic device is a circuit board.

10. The method of claim 9, further comprising the step of removing said support structure from said electronic component, and wherein said removing step occurs subsequent to said step of connecting said electronic component to said circuit board.

11. The method of claim 1, wherein said support structure comprises a non-circular structure.

12. A protective device for protecting an electrostatic discharge sensitive component, said protective device comprising:
    a support structure having an opening;
    adhesive material for connecting the protective device to the electrostatic discharge sensitive component; and
    conductive material for providing electrical contact with the electrostatic discharge sensitive component, said conductive material comprises ring-shaped metal layers, and said conductive material being located on said support structure surrounding said opening.

13. The protective device of claim 12, wherein said adhesive material is in the form of a ring surrounding said opening.

14. The protective device of claim 13, wherein said adhesive material and said conductive material are in the form of concentric rings.

15. The protective device of claim 14, wherein said adhesive material is located radially inside of said conductive material.

16. The protective device of claim 15, wherein said support structure is comprises a sheet of flexible material.

17. A packaged electronic assembly, said assembly comprising:
    an electronic component including an electrostatic discharge sensitive element and exposed conductive leads; and
    a protective device for protecting said electrostatic discharge sensitive element, said protective device including a support structure and conductive material, said support structure having an opening, said conductive material being located on said support structure, said conductive material comprises ring-shaped metal layers, said electronic component being received in said opening, and said conductive material being in electrical contact with said exposed leads.

18. The assembly of claim 17, further comprising adhesive material connecting said support structure to said leads.

19. The assembly of claim 18, wherein said conductive material comprises a deposited layer of metal.

20. The assembly of claim 17, wherein said leads are non-linear.

21. The assembly of claim 20, wherein inner portions of said non-linear leads are located within said opening.

22. The assembly of claim 17, wherein said electronic component is packaged between opposed tapes.

23. The assembly of claim 22, wherein said protective device is located between said electronic component and one of said tapes.

24. A taped electronic components assembly, comprising:
    first and second tapes;
    electronic components located between said tapes, said electronic components having electrically conductive leads, said electronic components having electrically conductive material in electrical contact with said electrically conductive leads, said electrically conductive material providing an electrically conductive path among said electrically conductive leads, said electrically conductive material being located between at least one of said tapes and at least some of said electrically conductive leads, wherein said conductive material is adhered to said first tape, and wherein said conductive material comprises ring-shaped metal layers, said electronic components being surrounded by said ring-shaped layers.

25. The assembly of claim 24, wherein portions of said electronic components extend through said ring-shaped metal layers.

26. The assembly of claim 24, wherein at least one of said first and second tapes has index holes for handling said assembly.

27. The assembly of claim 24, wherein both of said first and second tapes have index holes for handling said assembly.

28. The assembly of claim 24, wherein said tapes are releasably adhered to each other.

29. The assembly of claim 24, wherein said first tape has successive wells, said electronic components being located in said wells.

30. A taped electronic components assembly, comprising:
    an elongated tape structure;
    electronic components supported by said tape structure, said electronic components including electrically conductive leads; and
    electrically conductive material supported by said tape structure, said electrically conductive material being in electrical contact with said electrically conductive leads, said electrically conductive material providing an electrically conductive path among at least some of said electrically conductive leads, wherein said electrically conductive material is located between said tape structure and said electrically conductive leads, and wherein said electrically conductive material includes ring-shaped metal layers.

31. The assembly of claim 30, wherein said tape structure comprises a first tape, and wherein said conductive material is adhered to said first tape.

32. The assembly of claim 30, wherein portions of said electronic components extend through said ring-shaped metal layers.

33. The assembly of claim 32, wherein said tape structure further comprises index holes.

34. The assembly of claim 33, wherein said tape structure comprises first and second tapes that are releasably adhered to each other.

35. The assembly of claim 34, wherein said first tape has successive wells, said electronic components being located in said wells.

36. The assembly of claim 30, wherein central portions of said electronic components extend through planes containing said ring-shaped metal layers.

* * * * *